United States Patent
Puente et al.

(10) Patent No.: US 11,380,968 B2
(45) Date of Patent: *Jul. 5, 2022

(54) DC BIAS CONFIGURATION FOR PIN DIODE SPDT SWITCH

(71) Applicant: SKYWORKS SOLUTIONS, INC., Irvine, CA (US)

(72) Inventors: Richard Mark Puente, Westminster, MA (US); Chi Nang Nguyen, Placentia, CA (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/082,160

(22) Filed: Oct. 28, 2020

(65) Prior Publication Data
US 2021/0135326 A1    May 6, 2021

Related U.S. Application Data

(60) Provisional application No. 62/928,496, filed on Oct. 31, 2019.

(51) Int. Cl.
| | | |
|---|---|---|
| *H04B 1/44* | (2006.01) | |
| *H03K 17/74* | (2006.01) | |
| *H01P 1/15* | (2006.01) | |

(52) U.S. Cl.
CPC ............... *H01P 1/15* (2013.01); *H03K 17/74* (2013.01); *H04B 1/44* (2013.01)

(58) Field of Classification Search
CPC . H04B 1/44; H04B 1/48; H03K 17/74; H03K 17/76; H03K 17/56; H03K 17/567;
(Continued)

(56) References Cited

U.S. PATENT DOCUMENTS

| | | |
|---|---|---|
| 5,054,114 A | 10/1991 | Erickson |
| 5,442,812 A | 8/1995 | Ishizaki et al. |

(Continued)

OTHER PUBLICATIONS

Mohammad, Bani H. S., CAD Modeling and Simulation of PIN Diode Attenuator, 1997, ProQuest Dissertations and Theses Professional, Order No. 1388263, (304356557), pp. 1-150, https://dialog.proquest.com/professional/docview/304356557?accountid=131444 (Year: 1997).*

(Continued)

*Primary Examiner* — Lana N Le
(74) *Attorney, Agent, or Firm* — Lando & Anastasi, LLP

(57) ABSTRACT

A transmit/receive switching assembly includes a symmetrical PIN diode-based switch to selectively connect an antenna port to one of a transmit port and a receive port, transmit bias control circuitry that receives a first bias control signal, receive bias control circuitry that receives a second bias control signal, and shunt bias control circuitry coupled between the symmetrical PIN diode-based switch and a reference node. The first and second bias control signals are simultaneously and oppositely switchable between first and second voltage values and together configured to operate the switch between a transmit mode where RF signal flow is enabled from the transmit port to the antenna port and isolation is provided between the antenna port and the receive port, and a receive mode where RF signal flow is enabled from the antenna port to the receive port and isolation is provided between the antenna port and the transmit port.

20 Claims, 7 Drawing Sheets

(58) Field of Classification Search
CPC .............. H03K 17/58; H03K 17/693; H03K 3/356182; H03K 17/002; H03K 17/162; H01P 1/15; H01P 1/185; H01P 1/127; H01P 1/22; H03H 7/255; H03H 7/0153; H03H 7/06; H03H 7/185; H03H 7/20; H03H 11/30; G01R 33/3628; G01R 33/3657; G01R 33/3664; H04W 52/028
See application file for complete search history.

(56) References Cited

U.S. PATENT DOCUMENTS

| | | | |
|---|---|---|---|
| 5,789,995 A | 8/1998 | Minasi | |
| 6,351,628 B1* | 2/2002 | Leizerovich | H04B 1/406 |
| | | | 455/552.1 |
| 6,356,536 B1* | 3/2002 | Repke | H04B 1/48 |
| | | | 370/282 |
| 6,999,786 B2* | 2/2006 | Iida | H04B 1/005 |
| | | | 455/550.1 |
| 7,391,283 B2 | 6/2008 | Kearns | |
| 7,546,089 B2* | 6/2009 | Bellantoni | H01P 5/04 |
| | | | 333/101 |
| 8,416,008 B2* | 4/2013 | Van Zyl | H03H 5/12 |
| | | | 327/432 |
| 9,787,305 B2 | 10/2017 | Liu et al. | |
| 9,917,579 B2* | 3/2018 | Foley | H03K 17/002 |
| 9,966,987 B2 | 5/2018 | Notargiacomo et al. | |
| 10,666,313 B2* | 5/2020 | Tombak | H04B 1/48 |
| 2002/0180510 A1 | 12/2002 | Tamura | |
| 2005/0146392 A1* | 7/2005 | Karlsson | H04B 1/48 |
| | | | 333/103 |
| 2010/0265004 A1 | 10/2010 | Suzuki | |
| 2011/0267154 A1* | 11/2011 | Carroll | H03K 17/693 |
| | | | 333/103 |
| 2016/0028391 A1* | 1/2016 | Li | H03K 17/687 |
| | | | 327/374 |
| 2016/0242113 A1* | 8/2016 | McIntyre | H04W 52/0209 |
| 2018/0013425 A1* | 1/2018 | Foley | H03K 17/74 |
| 2021/0152208 A1* | 5/2021 | Moreschi | H03K 17/002 |

OTHER PUBLICATIONS

Hindle, Pat, The State of RF/Microwave Switches, Nov. 2010, Microwave Journal, pp. 20-36. (Year: 2010).*

* cited by examiner

DC BIAS CONFIGURATION FOR PIN DIODE SPDT SWITCH

CROSS-REFERENCE TO RELATED APPLICATIONS

This application claims priority under 35 U.S.C. § 119(e) to U.S. Provisional Patent Application Ser. No. 62/928,496, titled DC BIAS CONFIGURATION FOR PIN DIODE SPDT SWITCH, filed Oct. 31, 2019, the content of which is incorporated herein by reference for all purposes.

BACKGROUND

There are a variety of applications in which it is necessary to switch signals having relatively high radio frequency (RF) power. For example, referring to FIG. 1, in communications systems a transmit/receive switch 110 is often used to allow a single antenna 120 to be used for both transmission and reception of RF communications signals. A typical transmit/receive switch 110 is generally a single-pole, double-throw (SPDT) switch, as shown in FIG. 1, that connects an antenna port 112 to either a transmit port 114 or a receive port 116. In certain applications, the signal power of the RF signal from the transmitter 130 is relatively high, and therefore the transmit/receive switch 110 needs to be able to both handle the high-power signal for transmission and provide sufficient isolation to protect the receiver 140 from being damaged by leakage of the high-power transmit signal into the receive path. For high power applications, the transmit/receive switch 110 is generally implemented using PIN diodes.

Legacy high-power PIN diode transmit/receive SPDT switches use individual control signals for each diode. The topology for switches of this type is shown in FIG. 2. Referring to FIG. 2, the transmit/receive switch 110 includes four PIN diodes, D1, D2, D3, and D4. With this configuration, the transmit/receive switch 110 includes a series-shunt diode combination in each of the transmit path (D1 and D3) and the receive path (D2 and D4). In the receive mode, the receive path series diode (D2) and transmit path shunt diode (D3) are forward biased "ON" and the transmit path series diode (D1) and receive path shunt diode (D4) are reversed biased "OFF". In the transmit mode, the receive path series diode (D2) and transmit path shunt diode (D3) are reverse biased "OFF" and the transmit path series diode (D1) and receive path shunt diode (D4) are forward biased "ON". Each series or shunt diode requires an individual control bias signal to operate. As shown in FIG. 2, the transmit path series diode (D1) receives a transmit series bias control signal via a first bias control contact 202, the receive path series diode (D2) receives a receive series bias control signal via a second bias control contact 204, and transmit path shunt diode (D3) receives a transmit shunt bias control signal via a third bias control contact 206, and the receive path shunt diode (D4) receives a receive shunt bias control signal via a fourth bias control contact 208. Each PIN diode D1, D2, D3, D4 and corresponding bias control contact 202, 204, 206, 208 also has associated bias control circuitry. For example, each of the transmit and receive series bias paths includes an inductive-capacitive network (inductor L2 and capacitors C4 and C7 for the transmit series bias, and inductor L3 and capacitors C5 and C8 for the receive series bias). Each of the transmit and receive shunt bias paths includes a resistive-capacitive-inductive network (capacitors C1 and C9, inductor L4 and resistor R2 for the transmit shunt bias, and capacitors C2 and C10, inductor L5 and resistor R3 for the receive shunt bias). In addition, the antenna port 112 has associated bias control circuitry for the antenna 120. For example, as shown in FIG. 2, antenna series bias circuitry includes a resistive-capacitive-inductive network of resistor R1, inductor L1, and capacitors C3 and C6, connected to an antenna bias control contact 210 for receiving an antenna bias control signal. The inductors L1-L5 act as RF "chokes" to prevent the RF transmit or receive signals from leaking into the biasing circuitry, the capacitors C3. C4, C5 similarly act as DC blocking elements to prevent unwanted leakage of the DC bias voltages/currents into the RF paths, C1, C2, C6-C10 act as RF bypass capacitors to provide a path to ground for RF signals, and the resistors R1-R3 are for current control.

In addition to the circuitry required to support individual bias controls for each of the four PIN diodes, D1, D2, D3, D4, the timing of the four individual bias control signals can be very complex. It can be critical that operation of the four PIN diodes D1, D2, D3, D4 is well synchronized, particularly to avoid the receive path being turned "ON" before the transmit path is turned "OFF" (which could damage the receiver 140). Achieving and maintaining very precise timing control of the four individual bias control signals can be difficult, particularly as operating conditions, such as temperature, power levels and/or frequencies of the RF signals being switched, can change over time.

Some attempts have been made to simplify the configuration of the transmit/receive switch 110 to address the above-noted concerns. The shunt PIN diode D4 in the receive path provides for additional isolation between the antenna 120 and the receiver 140 to protect components of the receiver 140 when the system is operating in the transmit mode. The shunt diode D3 in the transmit path provides a similar function, but as the transmitter components are generally more robust and capable of handling higher power than the receiver components, in certain instances this shunt diode D3 can be eliminated, thereby reducing the number of individual control signals by one. An example of this modified topology is shown in FIG. 3.

Referring to FIG. 3, in this example, the transmit/receive switch 110 includes asymmetrical switches implemented using PIN diodes, with a single series PIN diode (D1) in the transmit path and a series-shunt diode combination (D2 and D3) in the receive path. The bias circuitry for the three diodes PIN D1, D2, D3 is the same as in FIG. 2. Operation of the transmit/receive switch 110 configured as shown in FIG. 3 is illustrated in FIGS. 4A and 4B. In the receive mode (FIG. 4A), the receive series diode (D2) is forward biased, "ON" (corresponding switch 312 in FIG. 4A is closed), and the transmit series diode (D1) and the receive shunt diode (D3) are reversed biased, "OFF" (corresponding switches 314 and 316 in FIG. 4A are open). In the transmit mode (FIG. 4B), the receive series diode (D2) is reverse biased, "OFF" (corresponding switch 312 in FIG. 4B is open), and the transmit series diode (D1) and the receive shunt diode (D3) are forward biased, "ON" (corresponding switches 314 and 316 in FIG. 4B are closed). While slightly simplified relative to the topology of FIG. 2, the transmit/receive switch 110 configured as shown in FIG. 3 still requires three individual control signals that must be accurately synchronized. In addition, the trade-off for this simplification is that the functionality of the transmit shunt diode (FIG. 2) is lost.

SUMMARY OF INVENTION

Aspects and embodiments are directed to an improved DC biasing arrangement for a four-diode SPDT switch that may provide increased capability and performance with reduced complexity relative to conventional biasing arrangements for 4-diode SPDT switches.

According to one embodiment, a single-pole double-throw PIN-diode based switch assembly comprises a first series PIN diode connected between a first port and a second port, a second series PIN diode connected back-to-back with the first series PIN diode between the first port and a third port, a first shunt PIN diode connected between the second port and a reference node, and a second shunt PIN diode connected between the third port and the reference node. The single-pole double-throw PIN-diode based switch assembly further comprises a first bias control contact coupled to the second port and configured to receive a first bias control signal, and a second bias control contact coupled to the third port and configured to receive a second bias control signal, the first and second bias control signals being simultaneously selectively and oppositely switchable between a first voltage value and a second voltage value, such that when the first bias control signal has the first voltage value, the second bias control signal has the second value, and when the first bias control signal has the second voltage value, the second bias control signal has the first voltage value, the first and second bias control signals together configured to control a bias condition of each of the first series PIN diode, the second series PIN diode, the first shunt PIN diode, and the second shunt PIN diode to operate the switch between a first mode of operation in which signal flow is enabled between the first port and the second port and isolation is provided between the first port and the third port, and a second mode of operation in which signal flow is enabled between the first port and the third port and isolation is provided between the first port and the second port.

The single-pole double-throw PIN-diode based switch assembly may further comprise shunt bias circuitry connected between the first shunt PIN diode and the reference node and between the second shunt PIN diode and the reference node. In one example, the shunt bias control circuitry includes an inductor and a resistor connected in series between the reference node and the first and second shunt PIN diodes, a first capacitor connected from a node between the inductor and the resistor to ground, and a second capacitor connected from a node between the inductor and the first and second shunt PIN diodes to ground. In one example, the reference node is coupled to ground. In another example, the reference node is coupled to a voltage source.

In one example, the single-pole double-throw PIN-diode based switch assembly further comprises a first series bias circuit connected to the first series PIN diode and to the first bias control contact. The the first series bias circuit may include a first capacitor connected between the first series PIN diode and the second port, a second capacitor connected between the first bias control contact and ground, and a first inductor connected between the first series PIN diode and the first bias control contact. In another example, the single-pole double-throw PIN-diode based switch assembly further comprises a second series bias circuit connected to the second series PIN diode and to the second bias control contact. The second series bias circuit may include a third capacitor connected between the second series PIN diode and the third port, a fourth capacitor connected between the second bias control contact and ground, and a second inductor connected between the second series PIN diode and the second bias control contact.

In one example, the shunt bias control circuitry includes an inductive-capacitive-resistive circuit. The single-pole double-throw PIN-diode based switch assembly may further comprise a first series bias circuit connected to the first series PIN diode and to the first bias control contact, and a second series bias circuit connected to the second series PIN diode and to the second bias control contact. In one example, each of the first and second series bias circuits includes an inductive-capacitive circuit.

According to another embodiment, a transmit/receive switching assembly comprises an antenna port, a transmit port, and a receive port, a symmetrical PIN diode-based switch configured to selectively connect the antenna port to one of the transmit port and the receive port, and transmit bias control circuitry coupled to the symmetrical PIN diode-based switch and including a transmit bias contact configured to receive a first bias control signal. The transmit/receive switching assembly further comprises receive bias control circuitry coupled to the symmetrical PIN diode-based switch and including a receive bias contact configured to receive a second bias control signal, the first and second bias control signals being simultaneously selectively and oppositely switchable between a first voltage value and a second voltage value, such that when the first bias control signal has the first voltage value, the second bias control signal has the second value, and when the first bias control signal has the second voltage value, the second bias control signal has the first voltage value, the first and second bias control signals together configured to operate the symmetrical PIN diode-based switch between a transmit mode in which signal flow is enabled from the transmit port to the antenna port and isolation is provided between the antenna port and the receive port, and a receive mode in which signal flow is enabled from the antenna port to the receive port and isolation is provided between the antenna port and the transmit port. The transmit/receive switching assembly further comprises shunt bias control circuitry coupled between the symmetrical PIN diode-based switch and a reference node.

In one example, the symmetrical PIN diode-based switch includes four PIN diodes.

In another example, the symmetrical PIN diode-based switch includes a first series PIN diode connected between the antenna port and the transmit port, a second series PIN diode connected back-to-back with the first series PIN diode between the antenna port and the receive port, a first shunt PIN diode connected between the transmit port and the shunt bias control circuitry, and a second shunt PIN diode connected between the receive port and the shunt bias control circuitry.

In one example, the shunt bias control circuitry includes an inductor and a resistor connected in series between the reference node and the first and second shunt PIN diodes, a first capacitor connected from a node between the inductor and the resistor to ground, and a second capacitor connected from a node between the inductor and the first and second shunt PIN diodes to ground. In one example, the reference node is coupled to ground. In another example, the reference node is coupled to a voltage source.

In another example, the transmit bias control circuitry includes a first capacitor connected between the first series PIN diode and the transmit port, a second capacitor connected between the first bias control contact and ground, and a first inductor connected between the first series PIN diode and the first bias control contact. In one example, the receive bias control circuitry includes a third capacitor connected between the second series PIN diode and the receive port, a fourth capacitor connected between the second bias control contact and ground, and a second inductor connected between the second series PIN diode and the second bias control contact.

In one example, each of the transmit bias control circuitry and the receive bias control circuitry includes an inductive-capacitive network. In another example, the shunt bias control circuitry includes an inductive-capacitive-resistive circuit.

According to another embodiment, a communications system comprises a transmitter, a receiver, an antenna, and a transmit/receive switching assembly including a symmetrical PIN diode-based switch configured to selectively connect the antenna to the transmitter during a transmit mode and antenna to the receiver during a receive mode, and bias control circuitry configured to operate the symmetrical PIN diode-based switch between the transmit mode and the receive mode, the symmetrical PIN diode-based switch including a pair of series PIN diodes and a pair of shunt PIN diodes, and the bias control circuitry including first and second bias control contacts configured to receive first and second bias control signals, respectively, the first and second bias control signals being simultaneously selectively and oppositely switchable between a first voltage value and a second voltage value, such that when the first bias control signal has the first voltage value, the second bias control signal has the second value, and when the first bias control signal has the second voltage value, the second bias control signal has the first voltage value.

In one example, the bias control circuitry includes transmit bias control circuitry coupled to a first series PIN diode of the pair of series PIN diodes and including a transmit bias contact configured to receive the first bias control signal, receive bias control circuitry coupled to a second series PIN diode of the pair of series PIN diodes and including a receive bias contact configured to receive the second bias control signal, and shunt bias control circuitry coupled between the pair of shunt PIN diodes and a reference node. In one example, the shunt bias control circuitry includes a first inductor and a resistor connected in series between the reference node and the pair of shunt PIN diodes, a first capacitor connected from a node between the first inductor and the resistor to ground, and a second capacitor connected from a node between the first inductor and the pair of shunt PIN diodes to ground. In another example, the transmit bias control circuitry includes a third capacitor connected between the first series PIN diode and a transmit port connected to the transmitter, a fourth capacitor connected between the first bias control contact and ground, and a second inductor connected between the first series PIN diode and the first bias control contact. In another example, the receive bias control circuitry includes a fifth capacitor connected between the second series PIN diode and a receive port connected to the receiver, a sixth capacitor connected between the second bias control contact and ground, and a third inductor connected between the second series PIN diode and the second bias control contact.

In one example, each of the transmit bias control circuitry and the receive bias control circuitry includes an inductive-capacitive circuit.

In another example, the shunt bias control circuitry includes an inductive-capacitive-resistive circuit.

In one example, the reference node is coupled to ground.

In another example, the reference node is coupled to a voltage source.

In one example, the transmitter includes a power amplifier and a transmit filter. In another example, the transmitter further includes a directional coupler.

In another example, the receiver includes a low noise amplifier and a receive filter.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Communications systems, such as cellular infrastructure Long-Term Evolution (LTE) Time Division Duplex (TDD) base stations and similar systems use high-power PIN diode single-pole, double-throw (SPDT) switches to switch between transmit and receive modes using a common RF antenna. As discussed above, conventional PIN diode-based transmit/receive switches require individual bias control signals for each PIN diode used in the switch architecture, which adds significant cost and complexity. For example, as discussed above, ensuring accurate synchronization of all individual bias control signals can be very challenging. In addition, the bias control circuitry, which may include discrete inductors, capacitors, and resistors, associated with each individual bias control signal adds significantly to the component count of the transmit/receive switch, requiring more circuit board space and adding cost. Further, referring again to FIG. 2, the two capacitors C1 and C2 associated with the transmit and receive shunt biasing circuitry each hold voltage for some time after the control signals to turn ON/OFF the shunt diodes D3 and D4 have been applied, and therefore with this configuration, switching is slower than may be desired. As discussed above, a conventional approach that attempts to alleviate at least some of the issues associated with the switch configuration of FIG. 2 is the slight simplification of FIG. 3.

Figure 1:
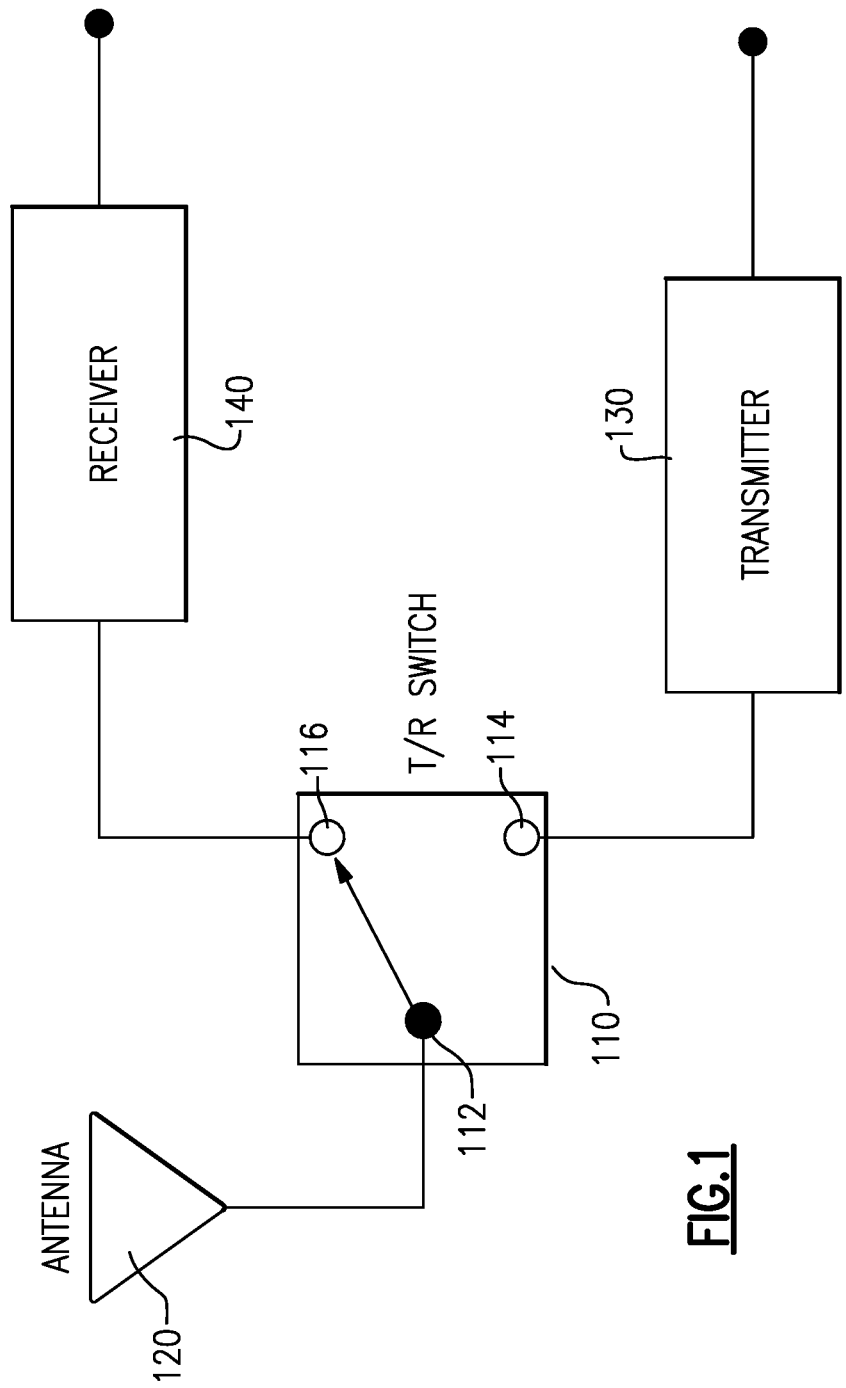
FIG. 1 is a block diagram of a portion of an RF front-end module including a transmit/receive switch.
Figure 2:
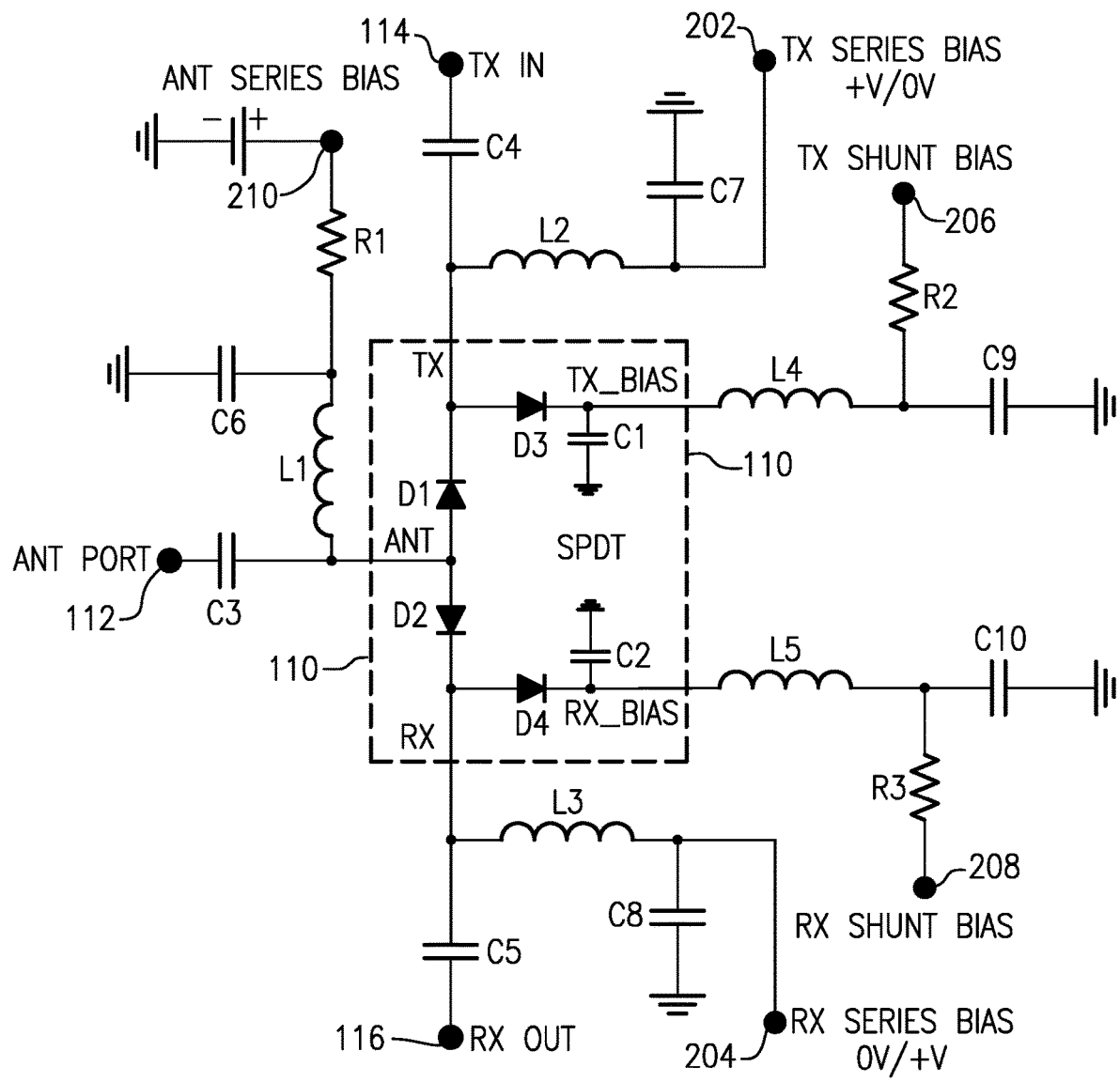
FIG. 2 is a diagram of one example of the transmit/receive switch of FIG. 1 implemented using PIN diodes.
Figure 3:
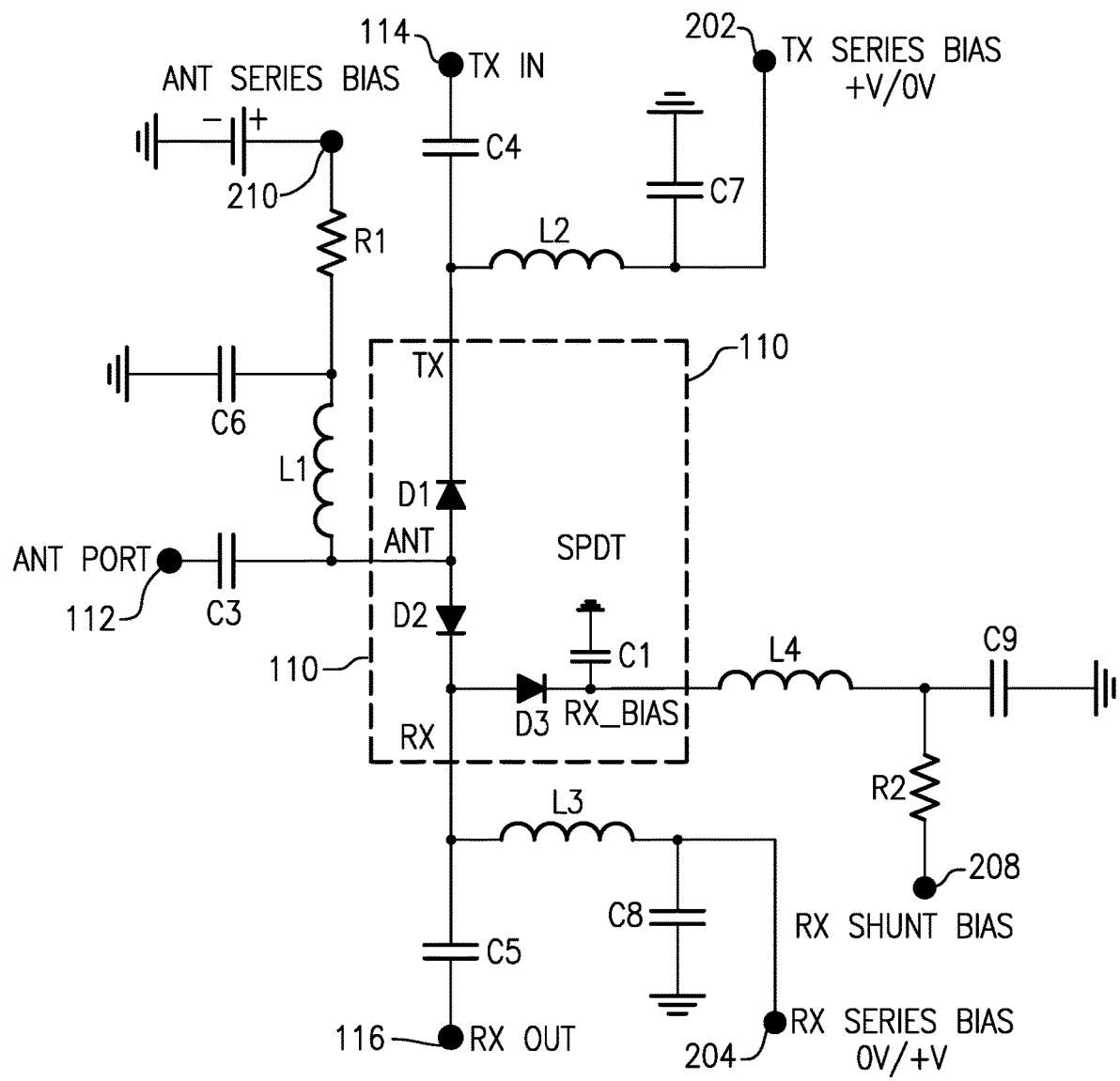
FIG. 3 is a diagram of an example of a conventional topology for the transmit/receive switch of FIG. 1 implemented using PIN diodes.
Figure 4A:
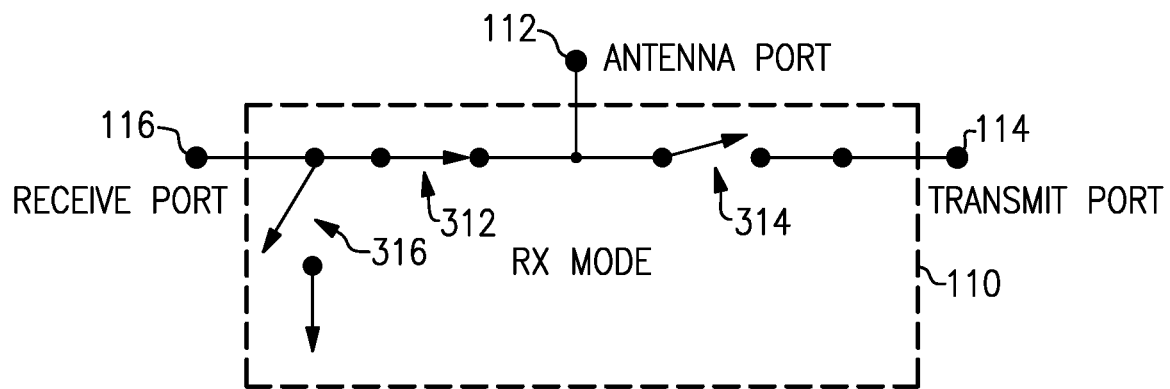
FIG. 4A is a block diagram illustrating operation of the transmit/receive switch of FIG. 3 in the receive mode.
Figure 4B:
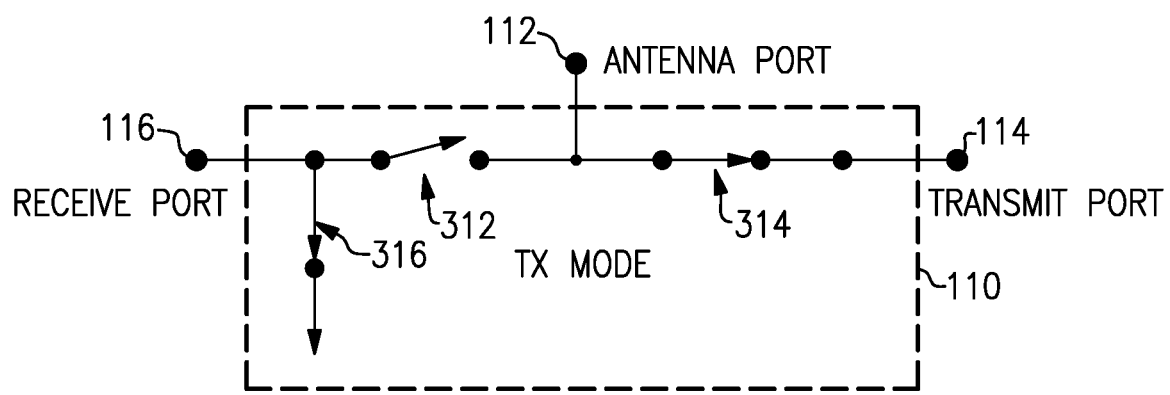
FIG. 4B is a block diagram illustrating operation of the transmit/receive switch of FIG. 3 in the transmit mode.

The traditional topology of FIG. 3 only uses a single series PIN diode (D1) on the transmit side to maintain low DC power dissipation when the transmit/receive switch 110 is operating in the transmit mode and to save circuit board space and cost by eliminating the transmit side shunt diode of FIG. 2. However, this design topology has very low isolation between the antenna port 112 and the transmitter port 114 (referred to as ANT-TX isolation), which could be much as 30 dB lower than the isolation on the receive side that uses a combination series-shunt diode configuration as discussed above. The theory behind the compromise of FIG. 3 is that because the RF power of the received signals is generally low (when the transmit/receive switch is operating in the receive mode), the transmitter 130 does not need high ANT-TX isolation to protect its components, and therefore the ANT-TX isolation may be as low as 10 dB. While this approach is acceptable in earlier transmit/receive time division duplex (TDD) communication systems where the transmit power may be up to about 100 W, it provides insufficient performance and capability for newer, communications applications that may use much higher RF transmit powers as well as higher RF signal frequencies.

Aspects and embodiments are directed to an improved high-power PIN diode switch design that is suitable for use as a transmit/receive switch in newer modern communications systems, including advanced 5GE and 5G infrastructure systems, where RF transmit powers may be as high as 320 W, higher RF frequencies (e.g., in the range of about 5-24 GHz) are used, and temperatures up to ~125° C. may have to be accommodated. Embodiments of the switch design disclosed herein may provide improved RF and DC performance over conventional topologies such as those of FIGS. 2 and 3, without significantly increasing complexity or cost. For certain advanced communications systems, in the receive mode, it may be critical to have low return loss at all three ports of the transmit/receive switch as well as low receive-path insertion loss to not increase the noise figure of the low noise amplifier that is typically connected to the receive port of the transmit/receive switch. In addition, in the transmit mode, high ANT-RX isolation may be critical to protect the low noise amplifier (which typically can handle only low RF power) from damage during high-power transmit operation. As discussed further below, aspects and embodiments provide an innovative switch configuration in which low receive-mode insertion loss and high ANT-RX isolation may be achieved at higher RF operating frequencies while both improving ANT-TX isolation in the receive mode and using a reduced number of external biasing components, without increasing bias control signal complexity.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

Figure 5A:
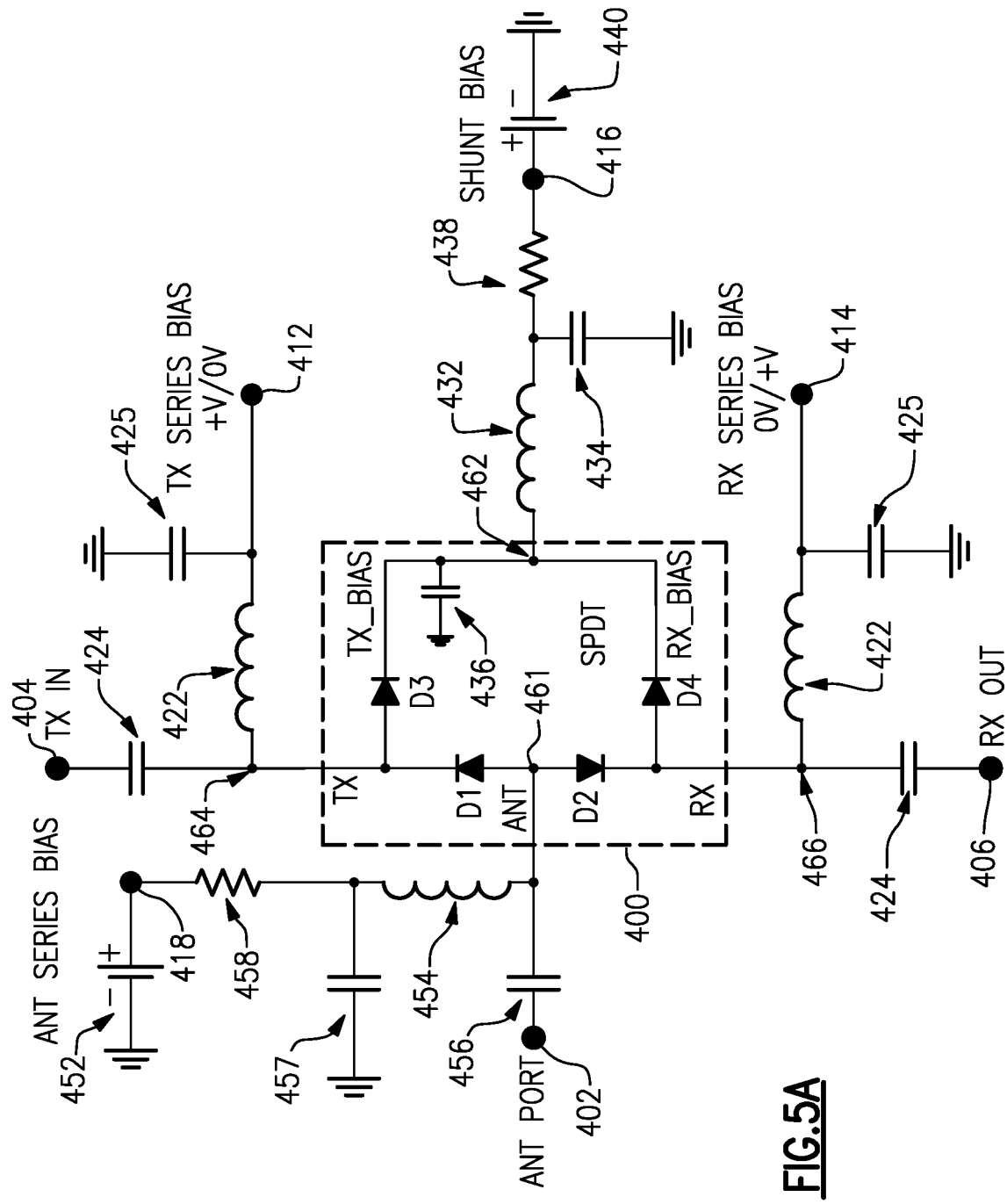
FIG. 5A is a diagram of one example of a PIN diode-based switch and associated bias control circuitry according to aspects of the present invention.

Referring to FIG. 5A there is illustrated a diagram of one example of PIN diode switch 400 with associated bias control circuitry according to certain embodiments. The switch 400, which may be used as a transmit/receive switch, is a symmetrical switch that includes four PIN diodes, namely a transmit series PIN diode, D1, connected between an antenna port 402 and a transmit port 404, a receive series PIN diode, D2, connected between the antenna port 402 and a receive port 406, a transmit shunt PIN diode, D3, and a receive shunt PIN diode, D4. The transmit series PIN diode, D1, receives a transmit series bias control signal via a first bias control contact 412, and the receive series PIN diode, D2, receives a receive series bias control signal via a second bias control contact 414. The transmit series bias control signal and the receive series bias control signal may be complementary signals, as discussed further below. In one example, the transmit series bias control signal and the receive series bias control signal are DC voltages, Vtb and Vrb, respectively, that can be "toggled" between a high value and a low value. In one example, the high value is a positive DC voltage value, +V, and the low value is zero volts (0V); however, in other examples, a value other than 0V may be selected for the low value. Each of the transmit series PIN diode, D1, and the receive series PIN diode, D2, has associated bias control circuitry that includes a capacitive-inductive (LC) network. In the illustrated example, each of these two LC networks includes an inductor 422 and a capacitor 425. The RF choke inductors 422 and bypass capacitors 425 act to prevent transmit or receive RF signals from leaking to the bias control contacts 412, 414, and the capacitors 424 act as DC blocking components to prevent DC voltage from the bias control signals from leaking into the transmit or receive RF paths.

The transmit and receive shunt PIN diodes, D3 and D4, share common shunt bias control circuitry and are connected to a common third bias control contact 416. In the illustrated example, the shunt bias control circuitry includes a resistive-inductive-capacitive (RLC) network, including an inductor 432, a first capacitor 434, a second capacitor 436, and a resistor 438. As in the case of the bias control circuitry for the transmit and receive series PIN diodes, D1 and D2, the inductor 432 acts as an RF choke, and the capacitors 434, 436 act as RF bypass components. The resistor 438 provides a current control function. In the example shown in FIG. 5A, the third bias control contact 416 is connected to a first voltage source 440 that may apply a fixed, predetermined voltage to the third bias control contact 416. In another example, shown in FIG. 5B, the third bias control contact 416 may instead be connected to ground, as discussed further below. A fixed antenna series bias voltage is applied by second voltage source 452 connected to a fourth bias control contact 418. The antenna port 402 and fourth bias control contact 418 have associated antenna bias control circuitry that, in the illustrated example, includes an RLC network including an inductor 454, a capacitor 457, and a resistor 458. As discussed above, the inductor 454 acts as an RF choke, the capacitor 456 provides DC blocking, the capacitor 457 provides the RF bypass, and the resistor 458 is for current control. Those skilled in the art will appreciate that any of the inductors 422, 432, 454, capacitors 424, 434, 436, 456, 457 and resistors 438, 458 may be implemented in practice using one or more discrete or lumped elements.

Figure 5B:
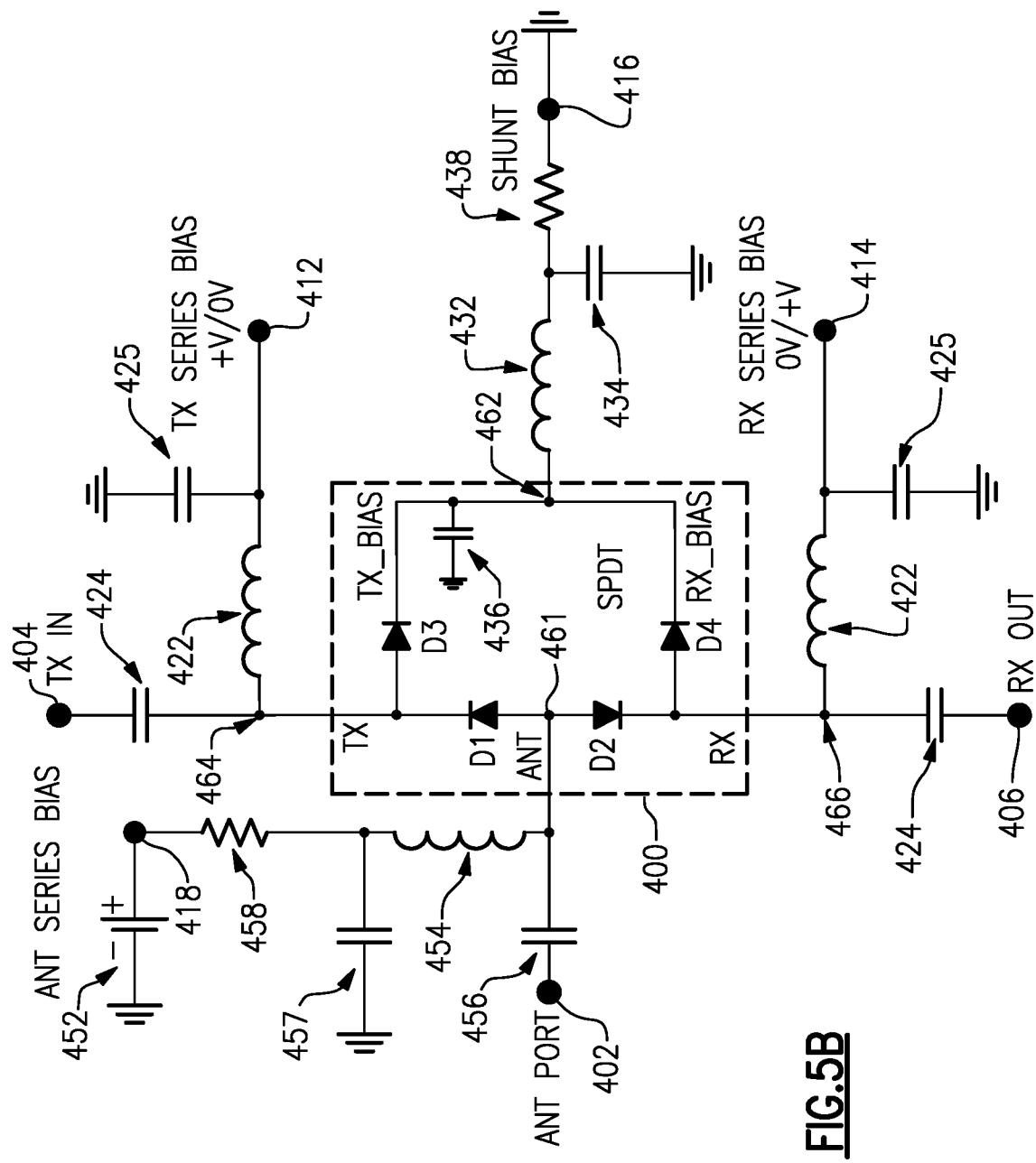
FIG. 5B is a diagram of a variation of the PIN diode-based switch and bias control circuitry of FIG. 5A according to aspects of the present invention.

Operation of the switch 400 shown in FIGS. 5A and 5B may be understood as follows. As discussed above, a fixed bias voltage is applied at the antenna (fourth) bias control contact 418 and a resulting fixed junction voltage is produced at the junction 461 between the anodes of the transmit and receive PIN diodes, D1 and D2. For example, this junction 461 voltage may be approximately 1 Volt (V). The shunt bias control circuitry may be configured such that a predetermined voltage, Vsb, is supplied at junction 462, where the cathodes of the transmit and receive shunt PIN diodes, D3 and D4, are connected together. For transmit operation (i.e., to configure the switch 400 into the transmit mode), the transmit series bias control signal, Vtb, (applied via the first bias control contact 412) is set to the high value, +V, with the high value being selected such that the voltage at junction 464 is higher than Vsb. At the same time, the receive series bias control signal, Vrb, (applied via the second bias control contact 414) is set to the low value (e.g., 0V), which is selected such that the voltage at junction 466 is lower than Vsb. Thus, the transmit series diode, D1, and the receive shunt diode, D4, are biased "ON" while the receive series diode, D2, and the transmit shunt diode, D3, are biased "OFF," thereby allowing the transmit RF signal to pass from the transmit port 404 to the antenna port 402 and providing high ANT-RX isolation. For receive operation, the transmit series bias control signal, Vtb, and the receive series bias control signal, Vrb, are toggled into the opposite state. That is, the transmit series bias control signal, Vtb, is set to the low value while simultaneously the receive series bias control signal, Vtb, is set to the high value. Thus, the voltage at the junction 464 is lower than Vsb and the voltage at junction 466 is higher than Vsb, thereby biasing the transmit series diode, D1, and the receive shunt diode, D4, "OFF" and biasing the receive series diode, D2, and the transmit shunt diode, D3, "ON" to allow the received RF signal to pass from the antenna port 402 to the receive port 406 while also providing high ANT-TX isolation. According to certain embodiments, the single bias control, Vsb, for the transmit and receive shunt diodes D3, D4 behaves like pseudo-differential design which uses only one shunt AC bypass capacitor, 436, as shown in FIGS. 5A and 5B, compared to the multi-signal shunt bias control of FIG. 2, which requires two capacitors C1 and C2. In certain examples, the capacitance value of the capacitor 436 can be made higher, for example twice as high, as the values of the capacitors C1 and C2 used in conventional designs, to tune for maximum ANT-RX isolation. This higher capacitance value may be beneficial to the design in terms of availability and tolerance when tuning for higher frequency operation.

In certain applications, the RF signal power of the transmit signals received at the transmit port 404 may be very high, for example up to 320 W. Accordingly, a large reverse bias voltage may be needed to keep the relevant PIN diodes biased "OFF" through large RF energy swings in the AC RF signals. For example, the value of +V may be as much as 20 V in some applications. As a result, the shunt bias voltage, Vsb, may also be a relatively high DC voltage (e.g., 19 V). In these high RF power and therefore high bias voltage applications, to reduce the current through the resistor 438, thereby enabling the resistor 438 to be made smaller, conserving circuit board space, the third bias contact 416 can be connected to the voltage source 440 as discussed above and shown in FIG. 5A. Using the voltage source 440 reduces the differential voltage across the resistor 438, reducing the current and/or allowing the value of the resistor 438 to be reduced. However, in other examples, the voltage source 440 may be eliminated and the third bias control contact can be connected to ground, as shown in FIG. 5B.

As discussed above, the switch 400 can be toggled (switched) between the transmit mode and the receive mode by simultaneously toggling the transmit series bias control signal, Vtb, and the receive series bias control signal, Vrb. Through the switching operation, the shunt bias voltage, Vsb, remains constant. Thus, the switching can be very fast because there is no need to alter the charge state of the capacitor 436. In addition, the switching is accomplished using only two variable bias control signals, namely the transmit series bias control signal, Vtb, and the receive series bias control signal, Vrb. Thus switch 400 thus provides the full functionality of the switch configuration of FIG. 2, and improved capability over the configuration of FIG. 3, while using only two bias control signals instead of four (FIG. 2) or three (FIG. 3). The signal timing considerations for embodiments of the switch 400 therefore may be significantly reduced relative to the configurations of FIGS. 2 and 3, since only two bias control signals (Vtb and Vrb) need be synchronized, rather than three or four. There are numerous mechanisms by which two complementary, well synchronized voltage signals can be produced and applied at respective contacts (first and second bias control contacts 412 and 414 in this case), as will be appreciated and understood by those skilled in the art. For example, an analog CMOS logic controller can be connected to both bias control contacts 412 and 414 to toggle the values of the bias control signals (Vtb and Vrb). Using the biasing configurations of FIG. 5A or 5B according to certain embodiments allows for a reduced external component count relative to the configuration of FIG. 2, while retaining all the functionality of that configuration and adding improvements over the configurations of FIGS. 2 and 3 in terms of faster switching speed and the ability to handle high RF transmit power and high RF frequencies. In addition, in various embodiments, both bias control signals Vtb and Vrb can be positive voltage signals that can be switched between a zero or low positive value and a higher positive value, thereby advantageously providing complementary signals without the need to generate negative voltages that can add complexity.

Figure 6:
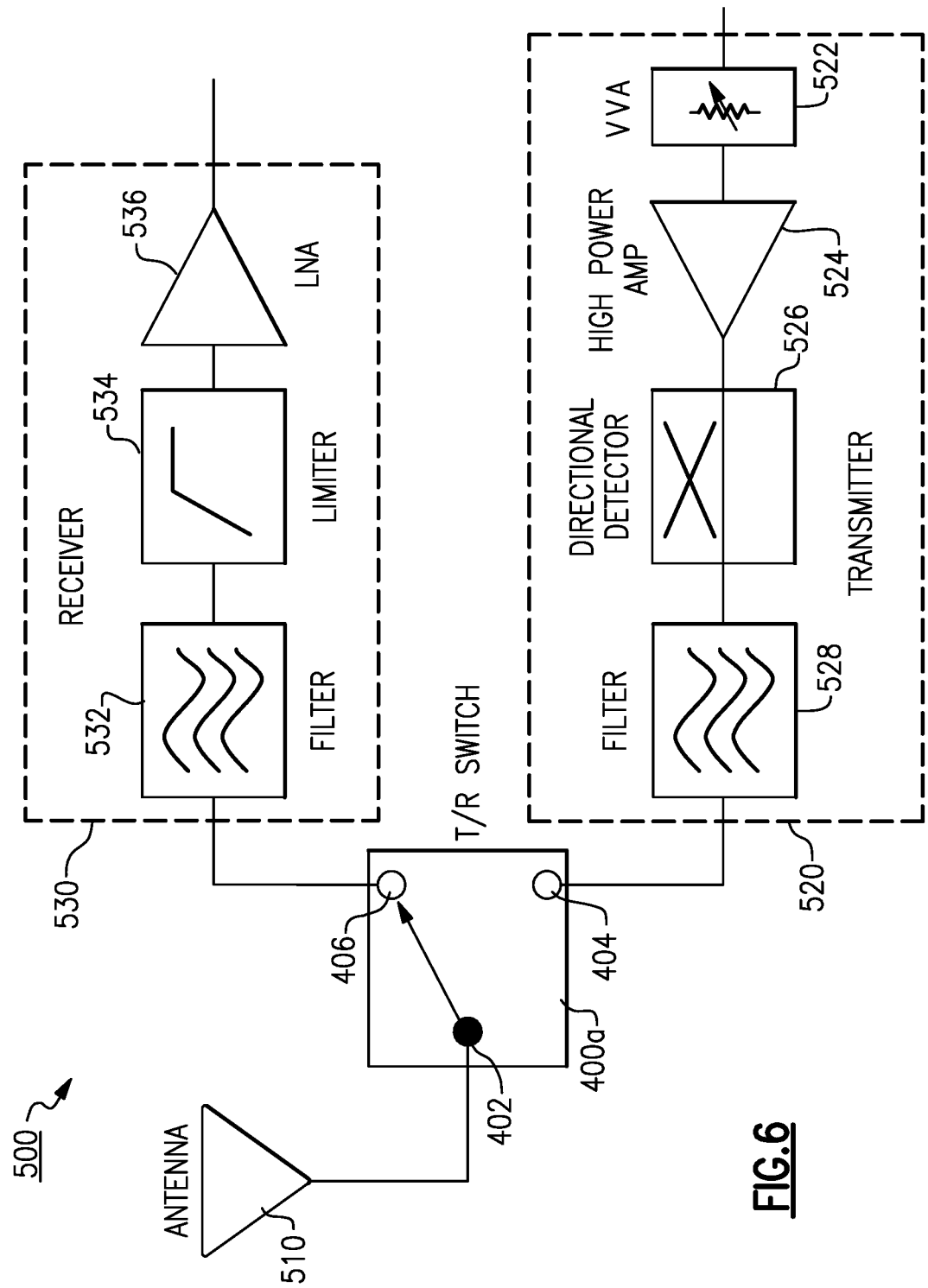
FIG. 6 is a block diagram of one example of a portion of an RF front-end module as may be used in a variety of infrastructure applications for transmission and reception of communications signals and in which a PIN diode based switch according to aspects of the present invention may be used.

As discussed above, embodiments of the switch 400 can be used as a transmit/receive switch in communications systems. FIG. 6 is a block diagram of a portion of a communications system 500 including an embodiment of the switch 400. In FIG. 6, transmit/receive switch 400a represents an example of the switch 400 and its associated bias circuitry, as shown in FIGS. 5A and 5B. The communications system 500 includes an antenna 510 connected to the antenna port 402 of the transmit/receive switch 400a, a transmitter 520 connected to the transmit port 404 of the transmit/receive switch 400a, and a receiver 530 connected to the receive port 406 of the transmit/receive switch 400a. The communications system 500 may be part of a wireless network infrastructure, such as a base station, for example. The antenna 510 may include any of a variety of antenna structures to allow the communications system 500 to transmit and receive RF signals in a range of frequency bands, including millimeter wave frequencies up to around 24 GHz in some applications.

The transmitter 520 is configured to generate signals for transmission, and includes a voltage variable attenuator (VVA) 522, a power amplifier 524, an electromagnetic coupler 526 (also referred to as a directional coupler), and a filter 528. Signals generated for transmission via the VVA 522 are received by the power amplifier 524. The power amplifier 524 can be used to amplify a wide variety of RF or other frequency-band transmission signals. For example, the power amplifier 524 can receive an enable signal that can be used to pulse the output of the power amplifier to aid in transmitting a wireless local area network (WLAN) signal or any other suitable pulsed signal. The power amplifier 524 can be configured to amplify any of a variety of types of signal, including, for example, a Global System for Mobile (GSM) signal, a code division multiple access (CDMA) signal, a W-CDMA signal, a Long Term Evolution (LTE) signal, or an EDGE signal. In certain examples, the directional coupler 526 can be used to extract a portion of the power from the RF signals traveling between the power amplifier 524 and the antenna 510 and measure characteristics of the coupled signal(s) to provide feedback for making adjustments to regulate the output power level of the power amplifier 524. In certain embodiments in which the communications system 500 uses a time division multiple access (TDMA) architecture, such as in GSM, CDMA, and W-CDMA applications, the directional coupler 526 can advantageously assist in managing the amplification of an RF transmitted power signal from the power amplifier 524, for example, by providing information to allow the transmitter 520 to shift power envelopes up and down within prescribed limits of power versus time. The filter 528 may perform various filtering functions (e.g., noise reduction, frequency band selection, etc.) as will be appreciated by those skilled in the art, given the benefit of this disclosure.

Still referring to FIG. 6, the receiver 530 includes a filter 532, a limiter 534, and a low noise amplifier 536. RF signals received from the antenna 510 via the transmit/receive switch 400a are amplified by the low noise amplifier (LNA) 536 and then provided to further processing circuitry (not shown in FIG. 6). Similar to the filter 528 in the transmitter 520, the filter 532 may perform various filtering functions typical in a receiver, as will be appreciated by those skilled in the art, given the benefit of this disclosure. The limiter 534 acts to protect the low noise amplifier 536.

As discussed above, for certain advanced communications systems and architectures, such as modern 5GE and 5G systems, for example, when the transmit/receive switch 400a is configured for the receive mode, it can be critical to provide low return loss at all ports 402, 404, 406 of the transmit/receive switch 400a, as well as low insertion loss in the receive path to reduce the noise figure of the low noise amplifier 536. In addition, when the transmit/receive switch 400a is configured for the transmit mode, very high ANT-RX isolation may be necessary to protect the low noise amplifier 536 from damage during high-power transmit operations. Aspects and embodiments of the transmit/receive switch 400a may provide an advantageous solution that meets the above-mentioned criteria while also offering reduced complexity and component count and improved capability relative to conventional transmit/receive switches. As discussed above with reference to FIGS. 5A and 5B, embodiments of the transmit/receive switch 400a provide greatly increased ANT-TX isolation in the receive mode over the conventional topology of FIG. 3 by including the transmit shunt PIN diode, D3, without increasing, and in fact decreasing, bias control signal complexity. By improving ANT-TX isolation and thereby reducing the signal power leakage to the transmit port 404 while in the receive mode, embodiments of the transmit/receive switch 400a extend the RF frequency of operation to 6 GHz, and beyond. The symmetrical switch topology of the transmit/receive switch 400a may also offer improved RF matching at all ports 402, 404, 406. Improved ANT-TX isolation helps to optimize the RF match of all three RF ports (402, 404, 406) due to isolated independent ports. Further, embodiments of the transmit/receive switch 400a offer improved ANT-RX insertion loss due to there being less power leakage to the transmit port 404.

Thus, aspects and embodiments provide a transmit/receive switch topology that offers numerous advantages and improvements over conventional transmit/receive switches and which is suitable for high-power, high-frequency applications, including, but not limited to, newer 5GE and 5G communications systems. As discussed above, embodiments of the switch 400 may use a reduced number of external biasing components relative to conventional switches, thereby saving circuit board space and cost. In addition, embodiments provide simpler bias control (e.g., simplified timing considerations) by reducing the number of switching bias control signals from three or four to only two. Embodiments of the transmit/receive switch 400a also offer improved RF matching at all ports 402, 404, 406, and lower receive path insertion loss at higher RF frequencies through improved ANT-TX isolation, as discussed above. The lower switch insertion loss in the receive path directly reduces the noise figure of the low noise amplifier 536 by lowering the loss in front of the low noise amplifier.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A single-pole double-throw PIN-diode based switch assembly comprising:
   a first series PIN diode connected between a first port and a second port;
   a second series PIN diode connected back-to-back with the first series PIN diode between the first port and a third port;
   a first shunt PIN diode connected between the second port and a reference node;
   a second shunt PIN diode connected between the third port and the reference node;
   a first bias control contact coupled to the second port and configured to receive a first bias control signal; and
   a second bias control contact coupled to the third port and configured to receive a second bias control signal, the first and second bias control signals being simultaneously selectively and oppositely switchable between a first voltage value and a second voltage value, such that when the first bias control signal has the first voltage value, the second bias control signal has the second value, and when the first bias control signal has the second voltage value, the second bias control signal has the first voltage value, the first and second bias control signals together configured to control a bias condition of each of the first series PIN diode, the second series PIN diode, the first shunt PIN diode, and the second shunt PIN diode to operate the switch between a first mode of operation in which signal flow is enabled between the first port and the second port and isolation is provided between the first port and the third port, and a second mode of operation in which signal flow is enabled between the first port and the third port and isolation is provided between the first port and the second port.

2. The single-pole double-throw PIN-diode based switch assembly of claim 1 further comprising:
shunt bias circuitry connected between the first shunt PIN diode and the reference node and between the second shunt PIN diode and the reference node.

3. The single-pole double-throw PIN-diode based switch assembly of claim 2 wherein the shunt bias control circuitry includes an inductor and a resistor connected in series between the reference node and the first and second shunt PIN diodes, a first capacitor connected from a node between the inductor and the resistor to ground, and a second capacitor connected from a node between the inductor and the first and second shunt PIN diodes to ground.

4. The single-pole double-throw PIN-diode based switch assembly of claim 3 wherein the reference node is coupled to ground.

5. The single-pole double-throw PIN-diode based switch assembly of claim 3 wherein the reference node is coupled to a voltage source.

6. The single-pole double-throw PIN-diode based switch assembly of claim 2 further comprising a first series bias circuit connected to the first series PIN diode and to the first bias control contact, the first series bias circuit including:
a first capacitor connected between the first series PIN diode and the second port;
a second capacitor connected between the first bias control contact and ground; and
a first inductor connected between the first series PIN diode and the first bias control contact.

7. The single-pole double-throw PIN-diode based switch assembly of claim 6 further comprising a second series bias circuit connected to the second series PIN diode and to the second bias control contact, the second series bias circuit including:
a third capacitor connected between the second series PIN diode and the third port;
a fourth capacitor connected between the second bias control contact and ground; and
a second inductor connected between the second series PIN diode and the second bias control contact.

8. The single-pole double-throw PIN-diode based switch assembly of claim 2 wherein the shunt bias control circuitry includes an inductive-capacitive-resistive circuit.

9. The single-pole double-throw PIN-diode based switch assembly of claim 8 further comprising:
a first series bias circuit connected to the first series PIN diode and to the first bias control contact; and
a second series bias circuit connected to the second series PIN diode and to the second bias control contact.

10. The single-pole double-throw PIN-diode based switch assembly of claim 9 wherein each of the first and second series bias circuits includes an inductive-capacitive circuit.

11. A transmit/receive switching assembly comprising:
an antenna port, a transmit port, and a receive port;
a symmetrical PIN diode-based switch configured to selectively connect the antenna port to one of the transmit port and the receive port;
transmit bias control circuitry coupled to the symmetrical PIN diode-based switch and including a transmit bias contact configured to receive a first bias control signal;
receive bias control circuitry coupled to the symmetrical PIN diode-based switch and including a receive bias contact configured to receive a second bias control signal, the first and second bias control signals being simultaneously selectively and oppositely switchable between a first voltage value and a second voltage value, such that when the first bias control signal has the first voltage value, the second bias control signal has the second value, and when the first bias control signal has the second voltage value, the second bias control signal has the first voltage value, the first and second bias control signals together configured to operate the symmetrical PIN diode-based switch between a transmit mode in which signal flow is enabled from the transmit port to the antenna port and isolation is provided between the antenna port and the receive port, and a receive mode in which signal flow is enabled from the antenna port to the receive port and isolation is provided between the antenna port and the transmit port; and
shunt bias control circuitry coupled between the symmetrical PIN diode-based switch and a reference node.

12. The transmit/receive switching assembly of claim 11 wherein the symmetrical PIN diode-based switch includes four PIN diodes.

13. The transmit/receive switching assembly of claim 11 wherein the symmetrical PIN diode-based switch includes:
a first series PIN diode connected between the antenna port and the transmit port;
a second series PIN diode connected back-to-back with the first series PIN diode between the antenna port and the receive port;
a first shunt PIN diode connected between the transmit port and the shunt bias control circuitry; and
a second shunt PIN diode connected between the receive port and the shunt bias control circuitry.

14. The transmit/receive switching assembly of claim 13 wherein the shunt bias control circuitry includes an inductor and a resistor connected in series between the reference node and the first and second shunt PIN diodes, a first capacitor connected from a node between the inductor and the resistor to ground, and a second capacitor connected from a node between the inductor and the first and second shunt PIN diodes to ground.

15. The transmit/receive switching assembly of claim 14 wherein the reference node is coupled to ground.

16. The transmit/receive switching assembly of claim 14 wherein the reference node is coupled to a voltage source.

17. The transmit/receive switching assembly of claim 13 wherein the transmit bias control circuitry includes:
a first capacitor connected between the first series PIN diode and the transmit port;
a second capacitor connected between the first bias control contact and ground; and
a first inductor connected between the first series PIN diode and the first bias control contact.

18. The transmit/receive switching assembly of claim 17 wherein the receive bias control circuitry includes:
a third capacitor connected between the second series PIN diode and the receive port;
a fourth capacitor connected between the second bias control contact and ground; and
a second inductor connected between the second series PIN diode and the second bias control contact.

19. The transmit/receive switching assembly of claim 11 wherein each of the transmit bias control circuitry and the receive bias control circuitry includes an inductive-capacitive network.

20. The transmit/receive switching assembly of claim 19 wherein the shunt bias control circuitry includes an inductive-capacitive-resistive circuit.

* * * * *